United States Patent [19]
Nakamura

[11] Patent Number: 5,436,916
[45] Date of Patent: Jul. 25, 1995

[54] ERROR CORRECTION BY DETECTION OF A DEGREE DIFFERENCE BETWEEN DIVIDEND AND DIVISOR POLYNOMIALS USED IN EUCLIDEAN ALGORITHM

[75] Inventor: Masaru Nakamura, Tokyo, Japan
[73] Assignee: NEC Corporation, Tokyo, Japan
[21] Appl. No.: 195,082
[22] Filed: Feb. 14, 1994
[30] Foreign Application Priority Data
Feb. 12, 1993 [JP] Japan .................. 5-024292
[51] Int. Cl.6 ............................................. G06F 11/10
[52] U.S. Cl. ................................................ 371/37.1
[58] Field of Search ...................... 371/37.1; 364/746.1
[56] References Cited

U.S. PATENT DOCUMENTS

| | | | |
|---|---|---|---|
| 5,185,711 | 2/1993 | Hattori | 364/746.1 |
| 5,325,373 | 6/1994 | Iwamura et al. | 371/37.1 |
| 5,341,385 | 8/1994 | Shirota | 371/37.1 |

FOREIGN PATENT DOCUMENTS 1-101742 4/1989 Japan .

*Primary Examiner*—Paul P. Gordon
*Attorney, Agent, or Firm*—Foley & Lardner

[57] ABSTRACT

Using a Euclidean algorithm for error correction, an error correcting circuit corrects bit errors in a received codeword by making a difference detecting circuit (13) detect a degree difference between a higher and a lower degree polynomial. When the difference is equal to one, a dividing circuit (11) is supplied in a first stage of the algorithm with the higher and the lower degree polynomials as a dividend and a divisor polynomial. When the difference is greater than one, the difference is decremented by one to provide an amount of shift, responsive to which a shifting circuit (15) shifts coefficients of the lower degree polynomial to higher degree terms to provide a shifted polynomial. In the first stage, the shifted polynomial is used as the divisor polynomial. Preferably, an error number is calculated. From an error location polynomial, an error location number is detected. Only when the error location number coincides with the error number, the bit errors are correctable.

5 Claims, 3 Drawing Sheets

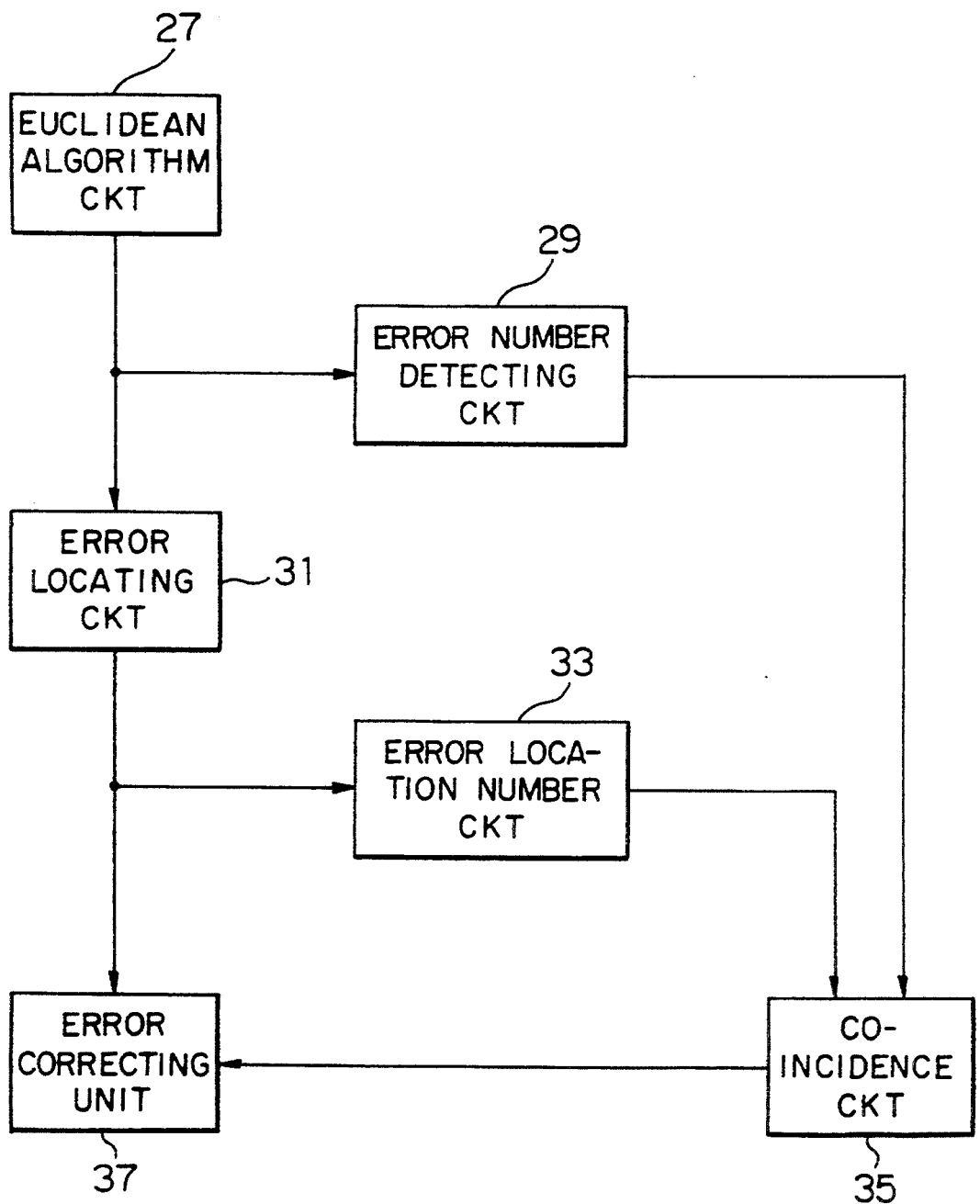
F I G. 3

ERROR CORRECTION BY DETECTION OF A DEGREE DIFFERENCE BETWEEN DIVIDEND AND DIVISOR POLYNOMIALS USED IN EUCLIDEAN ALGORITHM

BACKGROUND OF THE INVENTION:

This invention relates to an error correction circuit for correcting bit errors in a codeword which is either received or reproduced from a digital signal as a received codeword.

It is already known in correcting bit errors to use a Euclidean algorithm of error correction with addition, multiplication, and division carried out on a finite field $GF(2^m)$, where m represents an integer equal to one or greater. Based on the results of the Euclidean algorithm, it is possible to calculate an error location polynomial and an error value polynomial. An example is disclosed in Japanese Patent Prepublication (A) No. 101,742 of 1989.

In each of the successive stages of the Euclidean algorithm, a dividing circuit is used in dividing a dividend polynomial by a divisor polynomial, namely, a higher degree polynomial by a lower degree polynomial to provide a remainder polynomial of a degree which is herein referred to as a remainder degree. The higher and the lower degree polynomials have a degree difference which is equal to at least to one.

Preferably, the dividing circuit is the circuit disclosed in the specification of U.S. patent application Ser. No. 08/186,574 (pending) filed Jan. 26, 1994, by the present inventor. The application will herein be incorporated by reference.

The received codeword may include the bit errors of an error number, or the number of errors, this number is either less than a maximum number of correctable errors or not less than the maximum number. When the remainder degree is less than the maximum number, the remainder polynomial is said to satisfy a condition for error correction. Otherwise, the remainder polynomial does not satisfy the condition for error correction. The Euclidean algorithm is carried out consecutively in stages until an eventual remainder polynomial satisfies the condition.

The maximum number of correctable errors will now be denoted by t. A syndrome polynomial S(X) is derived from the received codeword in the manner known in the art. In the syndrome polynomial, coefficients of powers of X are represented by powers of a primitive element $\alpha$. Merely for convenience and clarity of print, such powers of the primitive element will herein be denoted by A(a) with its index treated as if an argument. The index is variable between zero and $(2^t-2)$, both inclusive. Incidentally, $A(2^t-1)=A(O)=1$. In an initial or first stage of the Euclidean algorithm, $X^{2t}$ is used as the dividend or the higher degree polynomial with the syndrome polynomial used as the divisor or the lower degree polynomial.

When the maximum number of correctable errors is equal to four, the syndrome polynomial may be:

$$S(X) = A(a)X^7 + A(b)X^6 + \ldots + A(c)X + A(d),$$

where each of a, b, c, and d represents one of zero through 254. At least one of the coefficients A(b), ..., and A(c) is not equal to zero. In this event, the remainder polynomial would be, in the first stage of the Euclidean algorithm a six-degree polynomial and is herein called a first remainder polynomial. In a second stage of the Euclidean algorithm, the syndrome polynomial is used as the higher degree polynomial with the first remainder polynomial used as the lower degree polynomial. The division would provide a five-degree polynomial as a second remainder polynomial. In a third stage, the first remainder polynomial is used as the higher degree polynomial with the second remainder polynomial used as the lower degree polynomial to provide a four-degree polynomial as a third remainder polynomial. In a fourth stage, the second remainder polynomial is used as the higher degree polynomial with the third remainder polynomial used as the lower degree polynomial to provide a three-degree polynomial as a fourth remainder polynomial. Now the remainder degree is less than the maximum number of correctable errors. In this case fourth remainder polynomial satisfies the condition for error correction. It becomes possible to calculate error locations and error patterns and to correct the bit errors.

In a conventional error correcting circuit, the dividing circuit has been put in operation in each stage of the Euclidean algorithm assuming that the degree difference is equal to one. This assumption is not always correct. In other words, the degree difference may be two or more. Such a case has not been studied in the prior art. As a consequence, misoperation has been unavoidable. It has been inevitable with the conventional error correcting circuit to erroneously calculate the error location polynomial and the error value polynomial to erroneously correct the bit errors incorrectly.

In addition, the received codeword may include the bit errors of an error number which is greater than the maximum number of correctable errors. In such an event, the conventional error correcting circuit judges the inability of correcting the bit errors to produce a flag which indicates that the received codeword should be dealt with by a different circuit. The conventional error correcting circuit is, however, capable of proceeding with the Euclidean algorithm to eventually erroneously produce the condition for error correction. As a result, the error location polynomial and the error value polynomial have been erroneously calculated with the conventional error correcting circuit to carry out miscorrection of the bit errors.

SUMMARY OF THE INVENTION

It is consequently a principal object of the present invention to provide an error correcting circuit capable of correctly proceeding with a Euclidean algorithm of error correction to exactly calculate an error location polynomial and an error value polynomial and to faithfully correct bit errors in a received codeword even when a higher degree polynomial and a lower degree polynomial have a degree difference of two or more.

It is a subordinate object of this invention to provide an error correcting circuit which is of the type described and which can correctly judge ability and inability of correcting the bit errors to reduce the possibility of miscorrection even if the received codeword includes bit errors in excess of a maximum number of correctable errors and, accordingly, when the error location and the error value polynomials are unreliable.

In accordance with this invention, there is provided an error correcting circuit which is for correcting bit errors in a received codeword by using a Euclidean algorithm of error correction which comprises: (A) a degree difference detecting circuit for detecting a degree difference between a higher degree polynomial and a lower degree polynomial to determine whether or not the degree difference is equal to one, the degree difference detecting circuit supplying the higher and the lower degree polynomials as a dividend and a divisor polynomial to a dividing circuit when the degree difference is equal to one, the degree difference detecting circuit calculating the degree difference minus one as an amount of shift when the degree difference is not equal to one; and (B) a shifting circuit responsive to the amount of shift for producing a shifted polynomial by shifting coefficients of the lower degree polynomial by the amount of shift towards higher degree terms to supply the shifted polynomial as the divisor polynomial to the dividing circuit.

BRIEF DESCRIPTION OF THE DRAWING

FIG. 3 is a block diagram of an error correcting circuit according to a second embodiment of this invention.

DESCRIPTION OF THE PREFERRED EMBODIMENTS

Figure 1:
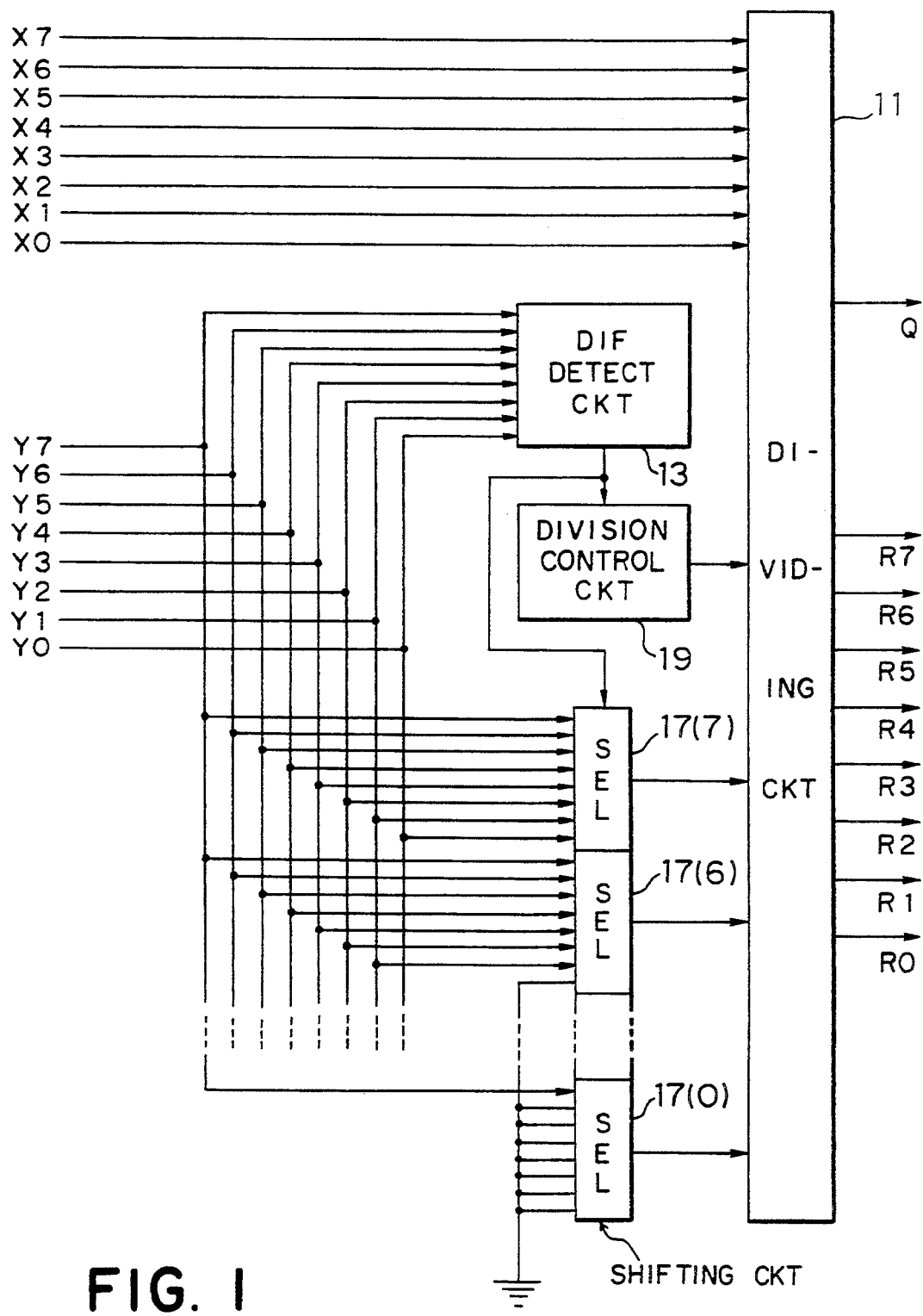
FIG. 1 is a block diagram of an error correcting circuit according to a first embodiment of the instant invention.

Referring to FIG. 1, an error correcting circuit is according to a first embodiment of the present invention and is for correcting bit errors in a received codeword by using a Euclidean algorithm of error correction. The received codeword includes the bit errors of an error number which is either less than a maximum number of correctable errors or alternatively equal to or greater than the maximum number. The Euclidean algorithm starts at an initial or first stage and proceeds, if necessary, to a second, third, and like consecutive stages.

For each of such successive stages of the Euclidean algorithm, a dividing circuit 11 has a structure which will later be described. The dividing circuit 11 is used in dividing a dividend polynomial DND by a divisor polynomial SOR to provide a quotient polynomial Q and a remainder polynomial R of a degree which is herein called a remainder degree. The dividend polynomial is a higher degree polynomial of a higher degree which is a degree difference DIF higher than a lower degree of a lower degree polynomial used as the divisor polynomial.

It is presumed in the first stage that the higher degree is equal to eight and that the lower degree is either equal to seven or less. The dividend and the divisor polynomials are therefore given by:

$$DND = X8X^8 + X7X^7 + X6X^6 + X5X^5 + X4X^4 + X3X^3 + X2X^2 + X1X + X0,$$

and $$SOR = Y7X^7 + Y6X^6 + Y5X^5 + Y4X^4 + Y3X^3 + Y2X^2 + Y1X + Y0,$$

where X8 through X0 and Y7 through Y0 represent coefficients of various terms of the dividend and the divisor polynomials respectively. In FIG. 1, the coefficient X8 is not depicted. The coefficients Y7 through Y0 of the divisor polynomial will be called seventh through zeroth coefficients. The remainder polynomial R has coefficients R7 through R0.

During the progress of the Euclidean algorithm, the higher, the lower, and the remainder degrees show a monotonous decrease until the remainder degree becomes less than the maximum number of correctable errors from a degree which is equal to or greater than the maximum number. At this instant of time, the Euclidean algorithm proceeds to a final stage which may be the first stage per se. The remainder polynomial is said to satisfy a condition for error correction. Operation of the dividing circuit 11 comes to an end. The Euclidean algorithm provides an error location polynomial and an error value polynomial to enable the error correcting circuit to correct the bit errors.

When the maximum number of correctable errors is equal to four, the higher degree polynomial is given by $X^8$ in the first stage with the lower degree polynomial given by a syndrome polynomial S(X) which is derived in the known manner from the received codeword with the bit errors and error locations in mind and may be represented by $A(a)X^7 + A(b)X^6 + \ldots + A(c)X + A(d)$ in the manner previously described. When the received codeword is represented by a polynomial which includes terms $(X + A(7))$, the syndrome polynomial may be represented by $A(e)X^6 + \ldots + A(f)X + A(g)$, where each of e, f, and g represents one of zero through 254. At least one of the coefficients $A(e), \ldots,$ and $A(f)$ is not equal to zero except for the coefficient $A(e)$ which is not equal to zero. In the first stage, the higher degree polynomial is given more in general by $X^{2t}$ when the maximum number is denoted by t.

As references 1 and 2, $X^8$ will be divided by a seven-degree syndrome polynomial $A(67)X^7 + A(132)X^6 + A(99)X^5 + A(168)X^4 + A(114)X^3 + A(142)X^2 + A(65)X + A(86)$ and by a six-degree syndrome polynomial $A(71)X^6 + A(87)X^5 + A(47)X^4 + A(28)X^3 + A(170)X^2 + A(176)X + A(170)$. In the following, only the coefficients are indicated.

The divisor polynomial is indicated along a top or first row labelled SOR. When calculation of the first stage of the Euclidean algorithm comes to an end, the quotient is obtained as a first quotient polynomial Q1(X) in the manner indicated along a second row labelled Q1. The dividend polynomial is represented by 1 alone as indicated along a third row. Along a fourth row, a first interim or intermediate product of the divisor polynomial and a first term of the first quotient polynomial is indicated. Along a fifth row, a first interim remainder is indicated. Along a sixth row, a second interim product of the divisor polynomial and a second term of the first quotient polynomial is indicated. In this manner, the remainder is eventually obtained at the end of the first stage as a first remainder polynomial R1(X) in the manner indicated along a bottom row. On calculating each of the remainders, the coefficients of each pair, such as A(32) and A(130) in the first interim remainder and in the second interim product, are represented by zero and/or one code bits with an Exclusive OR calculated between the code bits of each digit.

| | | | Reference 1: | | | | |
|---|---|---|---|---|---|---|---|
| SOR: | A(67) | A(132) | A(99) | A(168) | A(114) | A(142) | A(65) | A(86) |
| Q1: | A(188) | A(253) | | | | | | |

-continued

| | | | | | | | | |
|---|---|---|---|---|---|---|---|---|
| 1 | | | | | | | | |
| 1 | A(65) | A(32) | A(101) | A(47) | A(75) | A(253) | A(19) | |
| | A(65) | A(32) | A(101) | A(47) | A(75) | A(253) | A(19) | |
| | A(65) | A(130) | A(97) | A(165) | A(112) | A(140) | A(63) | A(84) |
| | | A(171) | A(191) | A(200) | A(254) | A(215) | A(234) | A(84) |

Reference 2:

| | | | | | | | | |
|---|---|---|---|---|---|---|---|---|
| SOR: | A(71) | A(87) | A(47) | A(28) | A(170) | A(176) | A(170) | |
| Q1: | A(184) | A(200) | A(35) | | | | | |
| 1 | | | | | | | | |
| 1 | A(16) | A(231) | A(212) | A(99) | A(105) | A(99) | | |
| | A(16) | A(231) | A(212) | A(99) | A(105) | A(99) | | |
| | A(16) | A(32) | A(247) | A(228) | A(115) | A(121) | A(115) | |
| | | A(107) | A(244) | A(83) | A(126) | A(79) | A(115) | |
| | | A(107) | A(123) | A(83) | A(54) | A(205) | A(212) | A(206) |
| | | | A(165) | 0 | A(154) | A(91) | A(50) | A(206) |

In FIG. 1, a degree difference detecting circuit 13 detects as regards the coefficients of the lower degree polynomial consecutively from the seventh coefficient Y7 towards the zeroth coefficient Y0 whether or not each of the first through the eighth coefficient is equal to zero. In this manner, the degree difference detecting circuit 13 produces a degree difference signal indicative of the degree difference DIF between the higher and the lower degree polynomials. When the degree difference is equal to two or more, the degree difference detecting circuit 13 calculates an amount of shift SFT by subtracting one from the degree difference and makes the degree difference signal indicate the amount of shift. In other words, the degree difference detecting circuit 13 detects whether or not the degree difference is equal to one. When the degree difference is not equal to one, the degree difference detecting circuit 13 calculates the amount of shift. The amount of shift is equal to zero when the degree difference is equal to one.

A shifting circuit 15 comprises zeroth through seventh selectors (SEL) 17(0), . . . , 17(6), and 17(7) in correspondence to the zeroth through the seventh coefficients Y0 to Y7, namely, to indexes 0 through 7 of X in the lower order polynomial. Each of the selectors 17 (suffixes omitted) has zeroth through seventh selector input terminals, a selector output terminal, and a selector control terminal. Attention will be directed to a variable p representative of one of 0 through 7, both inclusive. Among the selector input terminals, the zeroth through the (6-p)-th selector input terminals of the p-th selector 17(p) are grounded except for the seventh selector 17(7). The zeroth through the seventh selector input terminals of the seventh selector 17(7) are not grounded. Unless grounded, the zeroth through the seventh selector input terminals of the selectors 17 are supplied with the zeroth through the seventh coefficients as depicted. The selector control terminals of the selectors 17 are supplied with the degree difference signal.

When the degree difference is equal to one, the p-th selector 17(p) selects as a selected coefficient one of the zeroth through the seventh coefficients Y0 to Y7 that is supplied to the p-th selector input terminal and delivers the selected coefficient to its selector output terminal and then to the dividing circuit 11. It is consequently possible to understand in this event that the degree difference detecting circuit 13 supplies the lower degree polynomial to the dividing circuit 11 as the divisor polynomial with the shifting circuit 15 put out of operation.

When the degree difference indicates the amount of shift SFT, the p-th selector 17(p) selects as a shifted coefficient one of the zeroth through the seventh coefficients that is supplied to the (p-SFT)-th selector input terminal and delivers the shifted coefficient to the dividing circuit 11 through its selector output terminal. In such an event, the shifting circuit 15 is put in operation of shifting the seventh through the zeroth coefficients by the amount of shift towards higher degree terms, if any, of the lower degree polynomial to provide a shifted polynomial $Y(7-SFT)X^7 + Y(6-SFT)X^6 + Y(5-SFT)X^5 + Y(4-SFT)X^4 + Y(3-SFT)X^3 + Y(2-SFT)X^2 + Y(1-SFT)X + 0$ and to supply the shifted polynomial as the divisor polynomial to the dividing circuit 11.

It is now possible to proceed with the Euclidean algorithm with the degree difference regarded always as one even if the degree difference is actually equal to two or more. In consideration of the amount of shift, the error number is equal to a sum of the amount of shift plus that number of stages of the Euclidean algorithm which is carried out until the remainder polynomial satisfies the condition for error correction. The shifting circuit 15 is readily modified to deal with a lower degree polynomial which is other than the seven-degree polynomial in the first stage. Incidentally, it should be understood from the foregoing that the degree difference results in a difference in a calculation time in which the quotient and the remainder polynomials are calculated by the dividing circuit 11 and which depends on the degree difference.

In FIG. 1, a division control circuit 19 is interposed between the dividing circuit 11 and the degree difference detecting circuit 13. In correspondence to the degree difference DIF, the division control circuit 19 controls the dividing circuit 11.

Figure 2:
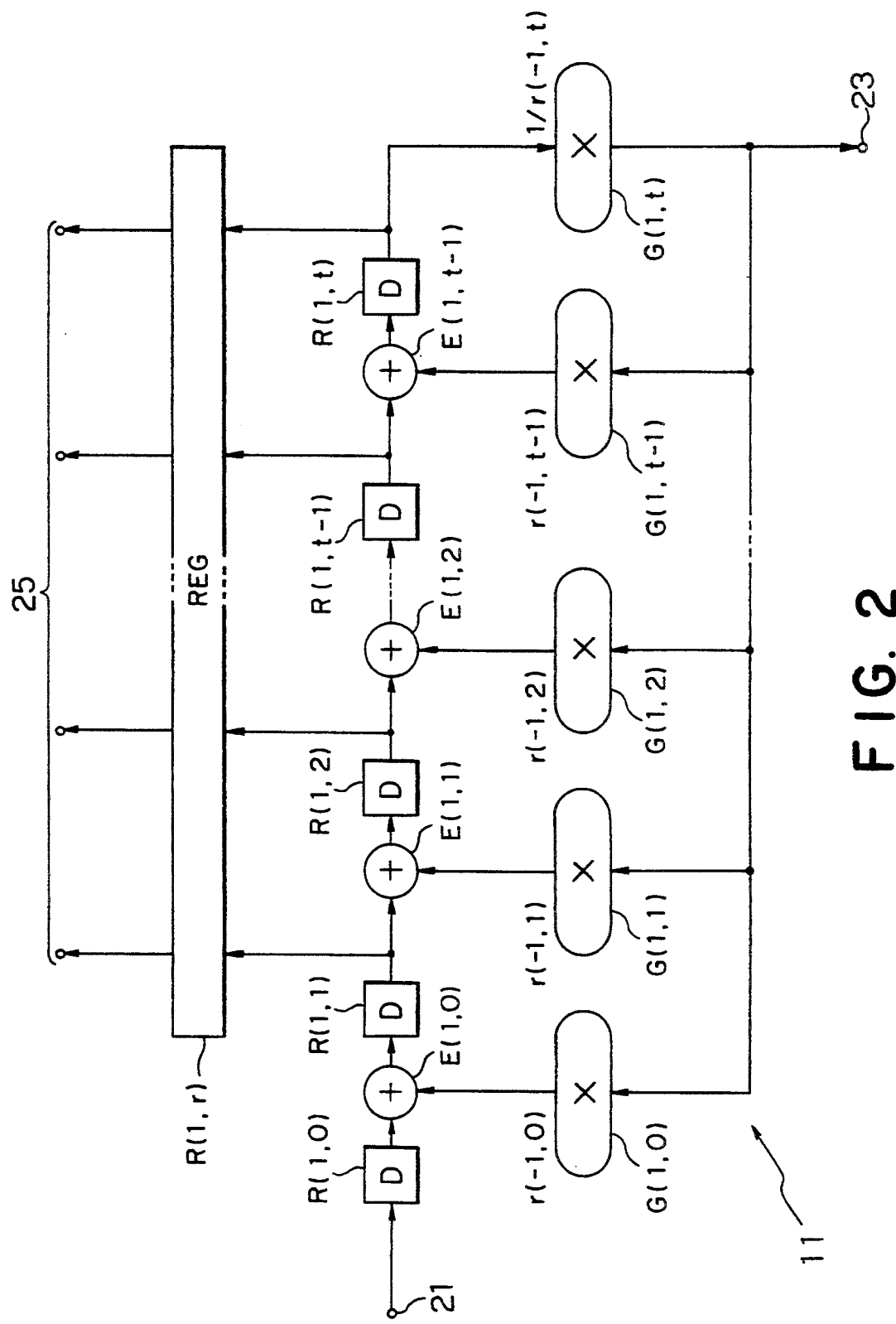
FIG. 2 is a block diagram of a dividing circuit for use in the error correcting circuit illustrated in FIG. 1.

Turning to FIG. 2, the dividing circuit 11 has a dividend input terminal 21, a quotient output terminal 23, and zeroth through (t−1)-th remainder output terminals 25. In the manner which will presently become clear, the dividing circuit 11 is supplied with a time slot signal indicative of t-th through zeroth time slots in a descending order with a common time slot interval in each stage of the Euclidean algorithm. For the first stage of the Euclidean algorithm, the higher and the lower degree polynomials will now be represented by:

$$R_{i-2}(X) = r(-2, m)X^m + r(-2, m-1)X^{m-1} + \ldots + r(-2, 1)X + r(-2, 0)$$

and $$R_{i-1}(X) = r(-1, n)X^n + r(-1, n-1)X^{n-1} + \ldots + r(-1, 1)X + r(-1, 0),$$

where m is greater than n by the degree difference DIF. When m is equal to (t+1), the shifted polynomial is a t-degree polynomial which consists of t-th through zeroth terms having t-th through zeroth indexes t, (t−1), ..., 2, 1, and 0 of X and t-th through zeroth coefficients r(−1, t), r(−1, t−1), ..., r(−1, 2), r(−1, 1), and r(−1, 0), where at least the t-th coefficient is not equal to zero.

Preferably, the dividing circuit 11 comprises zeroth, first, second, ..., (t−1)-th, and t-th multiplier circuits 10 (X) G(1, 0), G(1, 1), G(1, 2), ..., G(1, t−1), and G(1, t). The quotient output terminal 23 is connected to the t-th multiplier circuit G(1, t). The zeroth through the (t−1)-th multiplier circuits G(1, 0) to G(1, t−1) are connected to zeroth through (t−1)-th Exclusive OR circuits E(1, 0), E(1, 1), E(1, 2), ..., and E(1, t−1) and in common to the t-th multiplier circuit G(1, t).

The first stage will now be taken into consideration. The dividend input terminal 21 is successively supplied with m-th through zeroth coefficients r(−2, m) to (−2, 0) of the higher degree polynomial at the t-th through the zeroth time slots. Some of the coefficients, such as the zeroth coefficient, may not yet be delivered to the dividend input terminal 21 at the zeroth time slot. The zeroth through the (t−1)-th coefficients r(−1, 0) to r(−1, t−1) of the lower degree polynomial are preliminarily stored in the zeroth through the (t−1)-th multiplier circuits G(1, 0) to G(1, t−1). One by the t-th coefficient 1/r(−1, t) is preliminarily stored in the t-th multiplier circuit G(1, t).

A remainder register (REG) R(1, r) has zeroth through (t−1)-th register input terminals and zeroth through (t−1)-th register output terminals, which output terminals are connected to the zeroth through the (t−1)-th remainder output terminals 25. The zeroth Exclusive OR circuit E(1, 0) is connected to the dividend input terminal 21 through a zeroth delay circuit (D) R(1, 0). The first Exclusive OR circuit E(1, 1) is connected to the zeroth Exclusive OR circuit E(1, 0) through a first delay circuit R(1, 1), which is in turn connected to the zeroth register input terminal. The second Exclusive OR circuit E(1, 2) is connected to the first Exclusive OR circuit E(1, 1) through a second delay circuit R(1, 2) connected to the first register input terminal. In this manner, the (t−1)-th Exclusive OR circuit E(1, t−1) is connected to a (t−1)-th delay circuit R(1, t−1) which is connected to the (t−2)-th register input terminal. Interposed between the (t−1)-th Exclusive OR circuit E(1, t−1) and the t-th multiplier circuit G(1, t) is a t-th delay circuit R(1, t) which is connected to the (t−1)-th register input terminal.

Each of the zeroth through the t-th delay circuits R(1, 0) to R(1, t) is supplied with a circuit input signal and produces a circuit output signal with a delay equal to the common time slot interval. Consequently, the zeroth through the t-th delay circuits R(1, 0) to R(1, t) serve as zeroth through t-th stages of a shift register which is supplied with the time slot signal as a shift signal.

At the first time slot of the first stage of the Euclidean algorithm, the m-th coefficient of the higher degree polynomial is delivered from the t-th delay circuit R(1, t) to the t-th multiplier circuit G(1, t) and is divided by the t-th coefficient of the shifted polynomial to derive a first coefficient of the quotient polynomial and to deliver the first coefficient to the quotient output terminal 23 and to the (t−1)-th through the zeroth multiplier circuits G(1, t−1) to G(1, 0). Multiplying the first coefficient of the quotient polynomial by the (t−1)-th through the zeroth coefficients of the shifted signal, the (t−1)-th through the zeroth multiplier circuits E(1, t−1) to E(1, 0) deliver product signals to the (t−1)-th through the zeroth Exclusive OR circuits E(1, t−1) to E(1, 0).

Repeating such a process at the zeroth time slot of the first stage of the Euclidean algorithm, the dividing circuit 11 produces a second coefficient of the quotient polynomial at the quotient output terminal 23. When the degree difference is equal to one, all coefficients of the higher degree polynomial are processed by all coefficients of the shifted signal, which is identical in this event with the lower order polynomial. The remainder register R(1, r) delivers coefficients of the remainder polynomial to the remainder output terminals 25.

When the degree difference is equal to two, the zeroth multiplier circuit G(1, 0) is preliminarily loaded with zero. At the second time slot of the first stage of the Euclidean algorithm, the first coefficient of the quotient polynomial is delivered to the quotient output terminal 23. At the first time slot, the second coefficient of the quotient polynomial is supplied to the quotient output terminal 23. At the zeroth time slot, a third coefficient of the quotient polynomial is delivered to the quotient output terminal 23. The quotients of the remainder polynomial are delivered to the remainder output terminal 25. In this manner, the dividing circuit 11 calculates in the first stage the quotient and the remainder polynomials as a first quotient polynomial Q1(X) and a first remainder polynomial R1(X) irrespective of the degree difference.

As the prior art, the error correcting circuit checks whether or not the first remainder polynomial satisfies the condition for error correction. If the condition for error connection is not satisfied, the Euclidean algorithm proceeds to the second stage.

In the second stage, coefficients of the lower degree polynomial are successively supplied to the dividend input terminal 21. One by a coefficient of a highest degree term of the first remainder polynomial is stored in the t-th multiplier circuit G(1, t). Other coefficients of the first remainder polynomial are stored in the (t−1)-th through the zeroth multiplier circuits G(1, t−1) to G(1, 0). During the progress of the second stage, the quotient output terminal 23 is successively supplied with coefficients for use in a second quotient polynomial Q2(X). At the end of the second stage, the remainder output terminals 25 are supplied with coefficients of a second remainder polynomial R2(X).

In a similar manner, the dividing circuit 11 deals with the third and subsequent stages of the Euclidean algorithm to provide a third quotient polynomial Q3(X) and a third remainder polynomial R3(X), a fourth quotient polynomial Q4(X) and a fourth remainder polynomial R4(X), and so forth. One of the first and subsequent remainder polynomials satisfies the condition for error correction. The operation of the dividing circuit 11 comes to an end.

Referring now to FIG. 3, the description will proceed to an error correcting circuit according to a second embodiment of this invention. It will be surmised in the following that a primitive polynomial is given as:

$$f(X) = X^8 + X^4 + X^3 + X^2 + 1,$$

that a code length is sixteen bits long, that an all-zero codeword or data (0, 0, ..., 0, 0) is transmitted towards the error correcting circuit, and that the maximum number t of correctable errors is equal to four. As before, the higher degree polynomial is represented by $X^8$ in the first stage of the Euclidean algorithm.

In FIG. 3, the error correcting circuit comprises a Euclidean algorithm circuit 27 for controlling a combination 29 of the dividing circuit 11 (FIG. 1 or 2) and the degree difference detecting circuit 13 (FIG. 1). The first and other subsequent stages of the Euclidean algorithm are carried out until in an i-th stage an i-th remainder polynomial Ri(X) satisfies the condition for error correction. The combination 29 produces, among others, an error number signal representative of a sum of i and the amount of shift SFT as an error number. The combination 29 therefore serves as an error number detecting circuit.

Controlled by the Euclidean algorithm circuit 27 and by using the i-th remainder polynomial in the manner known in the art, an error locating circuit 31 calculates an error location polynomial indicative of error locations of the bit errors in the received codeword. By additionally using in the known manner the first through the (i−1)-th remainder polynomials and the first through the i-th quotient polynomials, the error locating circuit 31 calculates an error value polynomial.

Referring to the error location polynomial, an error location number detecting circuit 33 calculates an error location number of the error locations to produce an error location number signal representative of the error location number. Supplied with the error number signal and the error location number signals, a coincidence detecting circuit 35 compares the error number and the error location number to detect whether or not the error number and the error location number are coincident with each other. The coincidence detecting circuit 35 produces a coincidence and an incoincidence signal when these numbers are and are not coincident.

Responsive to the coincidence signal, an error correcting subcircuit or unit 37 uses the error location polynomial and the error value polynomial in correcting the bit errors. When the incoincidence signal is produced, it is judged that the bit errors are not correctable. Operation will be described with regard to several examples.

EXAMPLE 1

The received codeword is represented by $(0, 0, \ldots, 0, A(1))$. In this event, the syndrome polynomial is represented by:

$$S(X)=A(1)X^7+A(1)X^6+A(1)X^5+A(1)X^4+A(1)X^3+A(1)X^2+A(1)X+A(1).$$

The first quotient and remainder polynomials are as follows.

$$Q1(x)=A(254)X+A(254),$$

and $$R1(X)=A(0).$$

The first remainder polynomial satisfies the condition for error correction. The amount of shift is equal to zero. The error number is therefore equal to one.

EXAMPLE 2

The received codeword is represented by $(0, 0, \ldots, 0, A(2), A(1))$. The syndrome polynomial is represented by:

$$S(X)=A(201)X^7+A(113)X^6+A(192)X^5+A(139)X^4+A(101)X^3+A(224)X^2+A(51)X+A(26).$$

The quotient and the remainder polynomials are as follows.

$$Q1(X)=A(54)X+A(221),$$

$$R1(X)=A(166)X^6+A(190)X^5+A(107)X^4+A(238)X^3+A(20)X^2+A(72)X+A(247),$$

$$Q2(X)=A(35)X+A(209),$$

and ti $R2(X)=A(114).$

The second remainder polynomial is a zero-degree formula and satisfies the condition for error. The number of errors is equal to two.

EXAMPLE 3

The received codeword is represented by $(0, 0, \ldots, 0, A(0), A(7))$ and includes the term $(X+A(7))$. The syndrome polynomial is a six-degree polynomial:

$$S(X)=A(31)X^6+A(55)X^5+A(227)X^4+A(103)X^3+A(140)X^2+A(192)X+A(112).$$

The quotient and the remainder polynomials are as follows.

$$Q1(X)=A(224)X^2+A(248)X+A(223),$$

and $$R1(X)=A(168)X+A(80).$$

The first remainder polynomial satisfies the condition for error. The amount of shift is equal to one. As a consequence, the error number is equal to two.

EXAMPLE 4

The received codeword is represented by $(0, 0, \ldots, 0, A(8), A(4), A(2), A(1))$. The syndrome polynomial is represented by:

$$S(X)=A(36)X^7+A(150)X^6+A(241)X^5+A(120)X^4+A(111)X^3+A(200)X^2+A(209)X+A(238).$$

The quotient and the remainder polynomials are as follows.

$$Q1(X)=A(219)X+A(78),$$

$$R1(X)=A(146)X^6+A(106)X^5+A(3)X^4+A(165)X^3+A(166)X^2+A(117)X+A(61),$$

$$Q2(X)=A(145)X+A(51),$$

$$R2(X)=A(90)X^5+A(236)X^4+A(54)X^3+A(198)X^2+A(104)X+A(222),$$

$$Q3(X)=A(56)X+A(77),$$

$$R3(X)=A(26)X^4+A(98)X^3+A(133)X^2+A(141)X+A(112),$$

$$Q4(X) = A(64)X + A(239),$$

and $$R4(X) = A(199)X^3 + A(145)X^2 + A(204)X + A(206).$$

The fourth remainder polynomial satisfies the condition. The error number is therefore equal to four.

EXAMPLE 5

The received codeword is represented by $(0, 0, \ldots, 0, A(0), A(45), A(253), A(13))$. The syndrome polynomial becomes a five-degree polynomial with a constant of zero, namely:

$$S(X) = A(223)X^5 + A(126)X^4 + A(42)X^3 + A(37)X^2 + A(101)X.$$

The quotient and the remainder polynomials are as follows.

$$Q1(X) = A(32)X^3 + A(190)X^2 + A(192)X + A(244),$$

$$R1(X) = A(229)X^4 + A(46)X^3 + A(153)X^2 + A(90)X,$$

$$Q2(X) = A(249)X + A(53),$$

and $$R2(X) = A(105)X^3 + A(155)X^2 + A(121)X.$$

The second remainder polynomial satisfies the condition for error. The amount of shift is equal to two. As a result, the error number is equal to four.

EXAMPLE 6

The received codeword is represented by $(0, 0, \ldots, 0, A(16), A(8), A(4), A(2), A(1))$. The syndrome polynomial is represented by:

$$S(X) = A(236)X^7 + A(166)X^6 + A(243)X^5 + A(207)X^4 + A(85)X^3 + A(119)X^2 + A(239)X + A(253).$$

The quotient and the remainder polynomials are as follows.

$$Q1(X) = A(19)X + A(204),$$

$$R1(X) = A(168)X^6 + A(73)X^5 + A(245)X^4 + A(61)X^3 + A(165)X^2 + A(228)X + A(202),$$

$$Q2(X) = A(68)X + A(229),$$

$$R2(X) = A(185)X^5 + A(81)X^4 + A(60)X^3 + A(50)X^2 + A(6)X + A(149),$$

$$Q3(X) = A(238)X + A(254),$$

$$R3(X) = A(163)X^4 + A(146)X^3 + A(81)X^2 + A(188)X + A(101),$$

$$Q4(X) = A(22)X + A(85),$$

and $$R4(X) = A(183)X^3 + A(163)X^2 + A(144)X + A(73).$$

It appears that the fourth remainder polynomial satisfies the condition for error. On the other hand, the error location polynomial is calculated by the error locating circuit 31. The error location number detecting circuit 33 detects the error locations which are not equal to four in general and may be equal only by chance to four. The chance occurs with a very small probability which is equal in this case to:

$$(1/256)^4 \times (255/256)^{16-4}.$$

It is consequently possible in practice to put the error correction subcircuit 37 into operation when the coincidence detecting circuit 35 produces the coincidence signal. Either the coincidence detecting circuit 35 or the error correcting circuit 37 produces the flag mentioned hereinabove.

Reviewing FIGS. 1 through 3, it is appreciated that the dividing circuit 11 is correctly operable even when the dividend and the divisor polynomials have a degree difference of two or more. The error correcting circuit is capable of correctly deciding the number of bit errors and to reliably correct the bit errors when the error number does not exceed the maximum number of correctable errors.

What is claimed is:

1. An error correcting circuit for correcting bit errors in a received codeword by using a Euclidean algorithm of error correction, said error correcting circuit comprising:
   a degree difference detecting circuit for detecting a degree difference between a higher degree polynomial and a lower degree polynomial to determine whether or not said degree difference is equal to one, said degree difference detecting circuit supplying said higher degree polynomial and said lower degree polynomial as a dividend and a divisor polynomial to a dividing circuit when said degree difference is equal to one, said degree difference detecting circuit calculating said degree difference minus one as an amount of shift when said degree difference is not equal to one; and
   a shifting circuit responsive to said amount of shift for producing a shifted polynomial by shifting coefficients of said lower degree polynomial towards higher degree terms to supply said divisor polynomial to said dividing circuit.

2. An error correcting circuit as recited in claim 1, further comprising a division control circuit responsive to said degree difference for controlling a calculation time of said dividing circuit.

3. An error correcting circuit as recited in claim 2, wherein said higher degree polynomial and said shifted polynomial are arranged to have a degree difference of one.

4. An error correcting circuit as recited in claim 3, said Euclidean algorithm starting at a first stage, said lower degree polynomial being, in said first stage, an n-degree syndrome polynomial having n-th through zeroth coefficients, where n represents a natural number determined by said received codeword, said n-th coefficient being not equal to zero, said shifted polynomial having (n+SFT)-th through zeroth coefficients, where SFT represents said amount of shift, wherein said shifting circuit gives the (n+SFT)-th through SFT-th coefficients by the n-th through the zeroth coefficients of said lower degree polynomial with zero used as (SFT−1)-th through zeroth coefficients of said shifted polynomial.

5. An error correcting circuit as recited in claim 1, said Euclidean algorithm determining an error location polynomial, said error correcting circuit comprising:

an error number detecting circuit responsive to said Euclidean algorithm and said amount of shift for detecting an error number of said bit errors;

an error location detecting circuit for using said error location polynomial to detect an error location number;

a coincidence detecting circuit responsive to said error number and said error location number for detecting whether or not said error location number coincides with said error number, said coincidence detecting circuit producing a coincidence signal when said error location number coincides with said error and an incoincidence signal when said error location number does not coincide with said error number; and an error correcting subcircuit responsive to said coincidence signal for correcting said bit errors, said incoincidence signal indicating that said bit errors are not correctable.

* * * * *